(12) United States Patent
So et al.

(10) Patent No.: US 9,006,752 B2
(45) Date of Patent: Apr. 14, 2015

(54) METHOD AND APPARATUS FOR SENSING INFRARED RADIATION

(71) Applicant: University of Florida Research Foundation, Inc., Gainesville, FL (US)

(72) Inventors: Franky So, Gainesville, FL (US); Do Young Kim, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 14/176,572

(22) Filed: Feb. 10, 2014

(65) Prior Publication Data

US 2015/0001395 A1    Jan. 1, 2015

Related U.S. Application Data

(62) Division of application No. 13/511,869, filed as application No. PCT/US2010/058015 on Nov. 24, 2010, now Pat. No. 8,796,699.

(60) Provisional application No. 61/264,071, filed on Nov. 24, 2009.

(51) Int. Cl.
| | |
|---|---|
| *H01L 27/15* | (2006.01) |
| *H01L 31/12* | (2006.01) |
| *H01L 33/00* | (2010.01) |
| *G01J 5/20* | (2006.01) |
| *H01L 27/28* | (2006.01) |

(52) U.S. Cl.
CPC ............... *G01J 5/20* (2013.01); *H01L 27/288* (2013.01); *H01L 33/0045* (2013.01)

(58) Field of Classification Search
CPC .............. H01L 33/0045; H01L 27/288; Y10S 977/954; G01J 5/20
USPC .................. 257/82, E51.012, E31.1; 977/954
See application file for complete search history.

(56) References Cited

U.S. PATENT DOCUMENTS

| | | |
|---|---|---|
| 4,755,674 A | 7/1988 | Schaaf |
| 5,336,578 A | 8/1994 | Nukada et al. |
| 6,777,961 B2 | 8/2004 | Hamamoto et al. |
| 6,914,315 B2 | 7/2005 | Lai et al. |

(Continued)

FOREIGN PATENT DOCUMENTS

| | | |
|---|---|---|
| CN | 1773732 A | 5/2006 |
| JP | 61149831 A | 7/1986 |

(Continued)

*Primary Examiner* — David S Blum
(74) *Attorney, Agent, or Firm* — Wolf, Greenfield & Sacks, P.C.

(57) ABSTRACT

Embodiments of the invention pertain to a method and apparatus for sensing infrared (IR) radiation. In a specific embodiment, a night vision device can be fabricated by depositing a few layers of organic thin films. Embodiments of the subject device can operate at voltages in the range of 10-15 Volts and have lower manufacturing costs compared to conventional night vision devices. Embodiments of the device can incorporate an organic phototransistor in series with an organic light emitting device. In a specific embodiment, all electrodes are transparent to infrared light. An IR sensing layer can be incorporated with an OLED to provide IR-to-visible color up-conversion. Improved dark current characteristics can be achieved by incorporating a poor hole transport layer material as part of the IR sensing layer.

16 Claims, 11 Drawing Sheets

(56) References Cited

U.S. PATENT DOCUMENTS

| | | |
|---|---|---|
| 7,279,705 B2 | 10/2007 | Iou |
| 2003/0218166 A1 | 11/2003 | Tsutsui |
| 2004/0027059 A1 | 2/2004 | Tsutsui |
| 2004/0031965 A1 | 2/2004 | Forrest et al. |
| 2006/0011927 A1 | 1/2006 | Ko |
| 2006/0081840 A1 | 4/2006 | Mori et al. |
| 2006/0192125 A1 | 8/2006 | Yoganandan et al. |
| 2006/0222979 A1 | 10/2006 | Ishida et al. |
| 2007/0116983 A1 | 5/2007 | Kanno et al. |
| 2007/0129545 A1 | 6/2007 | Inoue et al. |
| 2007/0221888 A1 | 9/2007 | Sakata |
| 2008/0110499 A1 | 5/2008 | Chen et al. |
| 2009/0045728 A1 | 2/2009 | Murano et al. |
| 2009/0115310 A1 | 5/2009 | Yamamoto |
| 2009/0214967 A1 | 8/2009 | Iwanaga et al. |
| 2010/0133434 A1* | 6/2010 | Meng et al. ........ 250/338.4 |
| 2010/0133522 A1 | 6/2010 | Pieh et al. |
| 2011/0114921 A1 | 5/2011 | Yang et al. |
| 2011/0248249 A1 | 10/2011 | Forrest et al. |

FOREIGN PATENT DOCUMENTS

| | | |
|---|---|---|
| JP | 8007096 A | 1/1996 |
| JP | 2002-340668 A | 11/2002 |
| WO | WO 2008042859 A2 * | 4/2008 |

* cited by examiner

METHOD AND APPARATUS FOR SENSING INFRARED RADIATION

CROSS REFERENCE TO RELATED APPLICATIONS

The present application is a divisional of U.S. application Ser. No. 13/511,869, now U. S. Pat. No. 8,796,699, filed May 24, 2012, which is the U.S. National Stage Application of International Patent Application No. PCT/US2010/058015, filed Nov. 24, 2010, which claims the benefit of U.S. Provisional Application Ser. No. 61/264,071, filed Nov. 24, 2009, all of which are hereby incorporated by reference herein in their entirety, including any figures, tables, or drawings.

BACKGROUND OF INVENTION

Existing night vision goggles require very high operating voltages and cost thousands of dollars. Typical night vision goggles are complex electro-optical devices that intensify existing light instead of relying on their own light source. Night vision goggles can be sensitive to a broad spectrum of light, from visible through infrared. In a typical configuration, a conventional lens, called the objective lens, captures ambient light and some near-infrared light. The gathered light is then sent to an image-intensifier tube. The tube outputs a high voltage, typically about 5,000 volts, to the tube components. The image-intensifier tube can use a photo cathode to convert the photons of light energy into electrons. As the electrons pass through the tube, more electrons can be released from atoms in the tube, multiplying the original number of electrons by a factor of thousands. One method to accomplish this multiplication is through the use of a micro channel plate (MCP). The MCP is positioned in the tube such that when the electrons from the photo cathode hit the first electrode of the MCP, they can be accelerated into the glass micro channels by high voltage (about 5,000 Volts) bursts being sent between the electrodes of the electrode pair. As electrons pass through the micro channels, they cause other electrons to be released in each channel using a process called cascaded secondary emission. These new electrons can also collide with other atoms, creating a chain reaction that can result in thousands of electrons leaving the channel where only a few entered.

The image-intensifier tube can be positioned so that at the end of the tube, the cascaded electrons hit a screen coated with phosphors. These electrons maintain their position in relation to the channel they passed through. The energy of the electrons causes the phosphors to reach an excited state and release photons. These phosphors create the green image on the screen that has come to characterize night vision. Since the electrons stay in the same alignment as the original photons, a reliable image can be produced. The green phosphor image can be viewed through another lens, called the ocular lens that allows you to magnify and focus the image. The night vision device can be connected to an electronic display, such as a monitor, or the image can be viewed directly through the ocular lens.

Recently, light up-conversion devices have attracted a great deal of research interest because of their potential applications in night vision, range finding, and security, as well as semiconductor wafer inspections. Early near infrared (NIR) up-conversion devices were mostly based on the heterojunction structure of inorganic semiconductors. These devices consist of two parts in series: one part for photodetection and another for luminescence. The up-conversion devices are mainly distinguished by the method of photodetection. However, the up-conversion efficiencies of recent devices continue to be very low. For example, one NIR-to-visible light up-conversion device that integrates a light-emitting diode (LED) with a semiconductor based photodetector has only exhibited a maximum external conversion efficiency of 0.048 (4.8%) W/W. Even a hybrid organic/inorganic up-conversion device that integrates an inorganic InGaAs/InP photodetector with an organic light-emitting diode (OLED) only exhibits an external conversion efficiency of 0.7% W/W. In addition, current inorganic and hybrid up-conversion devices are expensive to fabricate and the processes used for fabricating these devices are not compatible with large area applications.

BRIEF SUMMARY

Embodiments of the invention pertain to a method and apparatus for sensing infrared (IR) radiation. Specific embodiments for sensing IR radiation provide improved dark current characteristics. An embodiment can incorporate an all-organic device. In one embodiment, an all-organic up-conversion device is provided that can be fabricated by integrating an organic light emitting device (OLED) and an organic photodetector into one device. An IR sensing layer of an OLED in accordance with an embodiment of the invention can be formed of a poor hole transporting layer. In certain embodiments, the IR sensing layer can be incorporated with an OLED to provide IR-to-visible color up-conversion.

In a specific embodiment, a night vision device can be fabricated by depositing a few layers of organic thin films. Embodiments of the subject device can operate at voltages in the range of 10-15 Volts and have lower manufacturing costs compared to conventional night vision devices. Embodiments of the device can incorporate an organic phototransistor in series with an organic light emitting device. In a specific embodiment, all electrodes are transparent to infrared light.

BRIEF DESCRIPTION OF DRAWINGS

FIG. 6A shows the characteristics when the device is dark and FIG. 6B shows the characteristics when the device is exposed to infrared radiation.

DETAILED DISCLOSURE

Embodiments of the invention pertain to a method and apparatus for sensing infrared (IR) radiation. An embodiment of the present invention provides an all-organic up-conversion device that can be fabricated by integrating an OLED and an organic photodetector into one device. Because of their compatibility with lightweight, rugged, or flexible plastic substrates, all organic up-conversion devices in accordance with embodiments of the present invention can be used for numerous applications including, but not limited to, night vision, range finding, security, and semiconductor wafer inspections.

In a specific embodiment, a night vision device can be fabricated by depositing a few layers of organic thin films. Embodiments of the subject device can operate at voltages in the range of 10-15 Volts and have lower manufacturing costs compared to conventional night vision devices. In a specific embodiment, all electrodes are transparent to infrared light.

The wavelength of the imaging device for thermal imaging can be adjusted by material selection. In a particular embodiment, the imaging device includes an infrared absorbing layer that has 3 layers, which are IR sensitive. An embodiment can incorporate a tandem light emitting device (LED) including multiple LED's in a stack. In a particular embodiment, one photon enters the imaging device and passes through five LED's in a stack, generating five photons as output. The five LED's stacked together uses a higher voltage than a single LED, but can still allow the device to operate at a low voltage. The five stacked LED's can also make the imaging device thicker than a device with a single LED and, therefore, less sensitive to noise.

Figure 1:
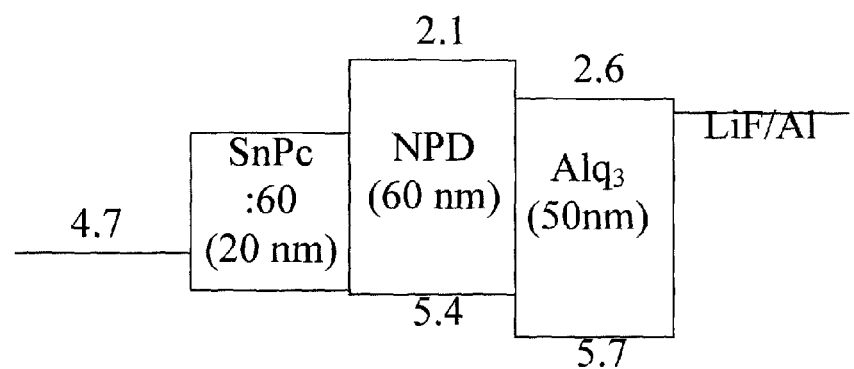
FIG. 1 shows an energy band diagram of an infrared sensing up-conversion device in accordance with an embodiment of the subject invention.

FIG. 1 shows an energy band diagram of an IR sensing up-conversion device which can be incorporated in an embodiment of the subject invention.

Embodiments of an IR sensing device, such as the device shown in FIG. 1, in accordance with the subject invention can have two parts, an IR sensitizer, or IR sensing layer, and a light emitting device. In an embodiment, the maximum quantum efficiency of the device shown in FIG. 1 is 100%. In an embodiment of the invention, in order to enhance performance, the device is fabricated with a tandem structure.

Figure 2:
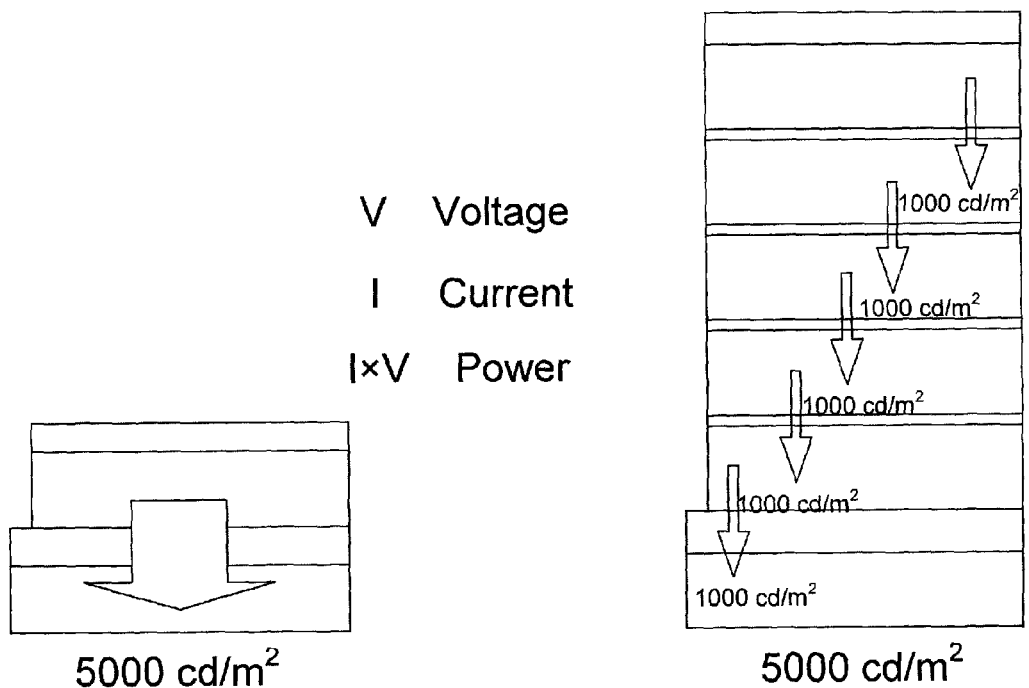
FIG. 2 shows a device structure in accordance with an embodiment of the subject invention that allows an electron to generate multiple photons.

FIG. 2 shows a device having such a tandem structure, incorporating an IR sensing layer and an LED, in accordance with an embodiment of the subject invention. With this structure, one electron can generate multiple photons. Incorporating this device architecture, the output of the device can be enhanced to achieve gain. Due to the increase thickness of the device, the dark current can be lowered and the device performance substantially improved.

Figure 3:
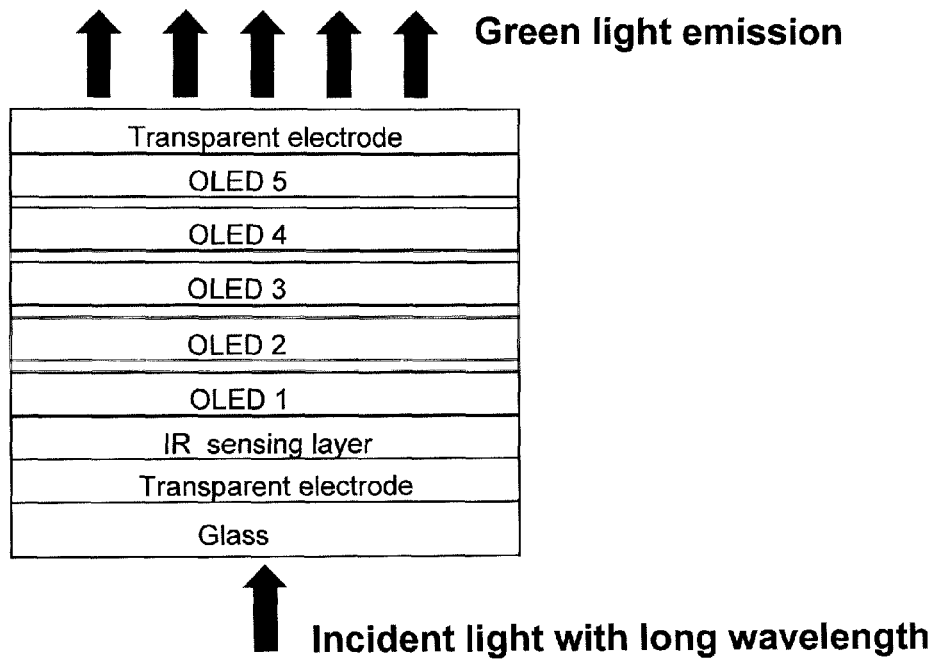
FIG. 3 shows the operation of an up-conversion device in accordance with an embodiment of the subject invention.

FIG. 3 shows the operation of an up-conversion device in accordance with an embodiment of the subject invention. As shown, light with an IR wavelength can enter the device through a transparent or semi-transparent substrate, such as glass or other appropriate transparent or semi-transparent material. A photon can then pass through a first transparent (or semi-transparent) electrode and strike an IR sensing layer. The IR sensing layer can be sensitive for the range 0.8 μm-2 μm in a specific embodiment. In further specific embodiments, the IR sensing layer can be sensitive to wavelengths in the range of 700 nm to 14 μm, in the range of 1 μm to 4 μm, and in the range of 1 μm to 3 μm. The IR sensing layer can then produce carriers, such as electrons and holes, such that the electrons, or holes, are passed to a stack of LEDs. In FIG. 3, organic light emitting devices (OLEDs) are shown but other light emitting devices can be used with the subject invention. In a particular embodiment the LEDs are transparent or semi-transparent. When the carriers, such as electrons, from the IR sensing layer enters the first LED (OLED in FIG. 3) and combine with corresponding carriers, such as holes, a photon can be generated and passed through the device. In the charge separation layer between the first and second LED (OLED 1 and OLED 2 in FIG. 3) an electron and a hole are generated, such that the hole can enter the first LED and combine with an electron entering the first LED from the IR sensing layer to produce a photon. Here, five LEDs are shown in series, therefore five photons can be generated for each photon which enters the device. The LEDs can be identical or can be different. As discussed below, the LEDs can be produced as thin films. Therefore, multiple LEDs can be stacked without producing an unwieldy device. In a particular embodiment, three to eight LEDs can be stacked in series. In further embodiments, more LEDs can be stacked. As additional LEDs are stacked, noise can be reduced even if the gain is not as high.

Referring to FIG. 3, in a specific embodiment, a hole blocking layer (not shown in FIG. 3) can be added between the transparent electrode the IR radiation enters and the IR sensing layer. Such a layer can block holes from passing from the transparent electrode to the IR sensing layer and/or from the IR sensing layer to the transparent electrode. Specific embodiments incorporating such a hole blocking layer can utilize ZnO nanoparticles, $TiO_2$ nanoparticles, or other appropriate materials known in the art. The ZnO nanoparticles or $TiO_2$ particles, and/or a ZnO layer or $TiO_2$ layer, can be deposited on the transparent electrode prior to adding the IR sensing layer.

As shown in FIG. 3, in a specific embodiment a second transparent (or semi-transparent) electrode, or cathode, can be disposed on the other side of the LED stack. In this embodiment, a potential between the pair of electrodes can drive the carriers, such as holes, from the IR sensing layer into the first LED and holes from each charge separation layer, where electrons and holes are generated, into the LED toward the cathode electrode. Likewise, electrons injected by the cathode are driven into the fifth LED and the electrons generated in the charge separation (generation) layers are driven into the LED toward the anode.

Transparent electrodes can be produced by replacing reflective electrode materials (such as aluminum) with transparent materials (such as indium-tin oxide). In one embodiment of the subject invention, a layered $CsCO_3$ (1 nm)/Ag (10 nm)/ITO (100 nm) electrode is used as the top electrode. The $CsCO_3$ interlayer lowers the cathode work-function to match the conduction (LUMO) energy of Phenyl-C61-Butyric-Acid-Methyl-Ester (PCBM), a material that can be used as part of the OLED. The thin Ag layer provides conductivity and the ITO layer provides encapsulation. Embodiments of this thin film stack have a 90% optical transmission and sheet resistance less than 5 ohm/sq, which is 70% lower than typical ITO electrodes. In a specific embodiment, a thin film of MgAg or ITO can be utilized as a transparent electrode, for example a transparent electrode in contact with the last light emitting device. The thin film can be 20 nm thick or less in a specific embodiment.

OLEDs can be produced that generate any wavelength of visible light. In one embodiment, an organic emissive layer includes three different dye molecules emitting blue, green, and red lights, respectively. By controlling the relative abundance of the three dye molecules in the device, white light with high color rendering index>90 can be achieved. In another embodiment, different colors are achieved by varying the relative abundance of the three dye molecules or by varying the power transmitted to the different molecules.

For transparent OLEDs, a transparent material (such as indium-tin oxide) can again be used as the cathode. In this way, photons can pass through the stacked OLEDs. The organic materials used in these devices are mostly transparent in the visible spectrum due to the high band gap of these materials (typically>3 eV). Exceptions can include the dye molecules from which the desired light emission is generated; however, the dye molecules can be incorporated as dopants (typical doping concentrations~1-10 wt %) in the emissive layer whose thickness is typically 10-30 nm. Therefore, the entire OLED device can achieve a very high transparency of 90% or higher.

In fabricating transparent OLEDs with triple-doped organic emissive layers, the damage to the underlying organic layers can be minimized during the sputter deposition of the indium-tin oxide transparent cathode. In addition, low sheet resistance, and high transparency can be obtained for the transparent electrode, and efficient charge injection at the electrode/organic interface can be achieved. As discussed above, a composite electrode of $CsCO_3/Ag/ITO$ can also be used as the transparent electrode for the OLEDs. Furthermore, a microlens array can also be fabricated on the substrate surface to enhance the extraction of light in that direction. Moreover, OLEDs can be produced that offer high quality lighting with a color rendering index larger than 90.

In a further embodiment, the electrodes and LEDs used are transmissive for some wavelengths of light and absorb other wavelengths.

According to certain embodiments, the light sensing layer can incorporate quantum dots such as PbSe and PbS quantum dots.

In a particular embodiment, the subject up-conversion devices can be incorporated into night vision goggles or other light amplifying devices. In a further embodiment, green OLEDs are used so that a green amplified image as produced as with conventional night vision goggles.

Figure 4:
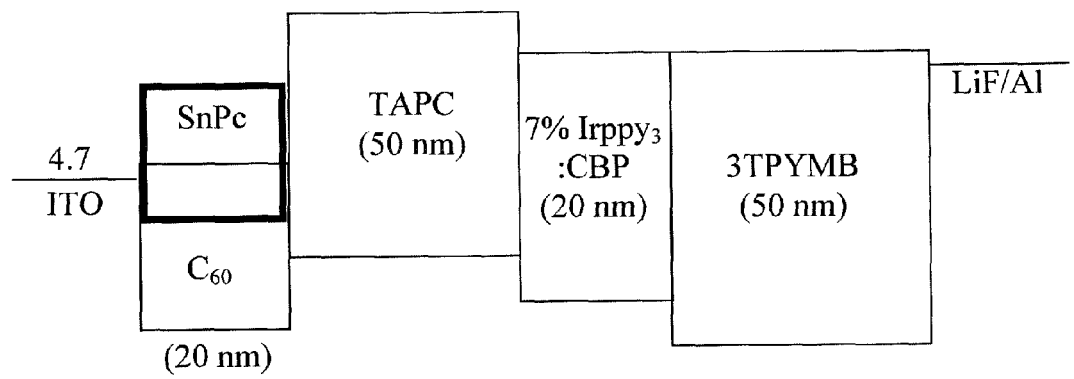
FIG. 4 shows an energy band diagram of another infrared sensing up-conversion device in accordance with an embodiment of the subject invention.

FIG. 4 shows an energy band diagram of another IR sensing up-conversion device in accordance with an embodiment of the subject invention. According to an embodiment, a poor hole injection and transport layer can be incorporated in the IR sensing up-conversion device to improve dark current characteristics. In specific embodiments, in order to reduce dark currents and, therefore, improve SNR, a material can be chosen for the hole injection and transport layer that has a current density of less than 1 $mA/cm^2$. In less preferred embodiments, materials with current densities greater than or equal to 1 $mA/cm^2$ can be used for the hole injection and transport layer, which would increase the injection of holes from the electrode when a voltage is applied so as to increase the dark current and reduce SNR. In one embodiment, a $SnPc:C_{60}$ mixed layer, which exhibits poor hole injection and hole transport, allows the device to have a low dark current without IR irradiation. In this embodiment, the OLED can be essentially turned-off when it is not exposed to IR radiation.

Figure 5:
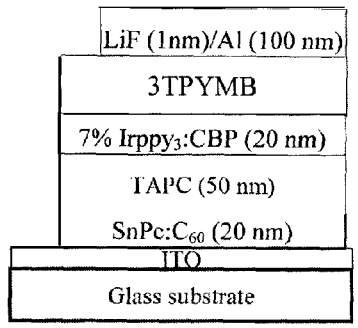
FIG. 5 shows a structural diagram of the device of FIG. 4.

FIG. 5 shows a structural diagram of the device of FIG. 4.

Referring to FIG. 5, an organic near infrared (NIR)-to-visible up-conversion device can be provided using a tin phthalocyanine $(SnPc):C_{60}$ bulk heterostructure layer as a NIR sensitizer and a fac-tris(2phenylpyridinato) iridium (III) ($Irppy_3$) layer as a phosphorescent emitter. By using a phosphorescent emitter, light generation can be accomplished using low energy, providing an energy-efficient OLED. As one difference from a conventional OLED structure, the up-conversion device according to an embodiment of the present invention incorporates a poor hole transport NIR-sensitizing layer to keep the device in the off-state in the absence of IR irradiation. Upon photo-excitation, the photo-generated holes are injected into the OLED and recombine with electrons injected from the cathode to give off visible light.

Figure 6A:
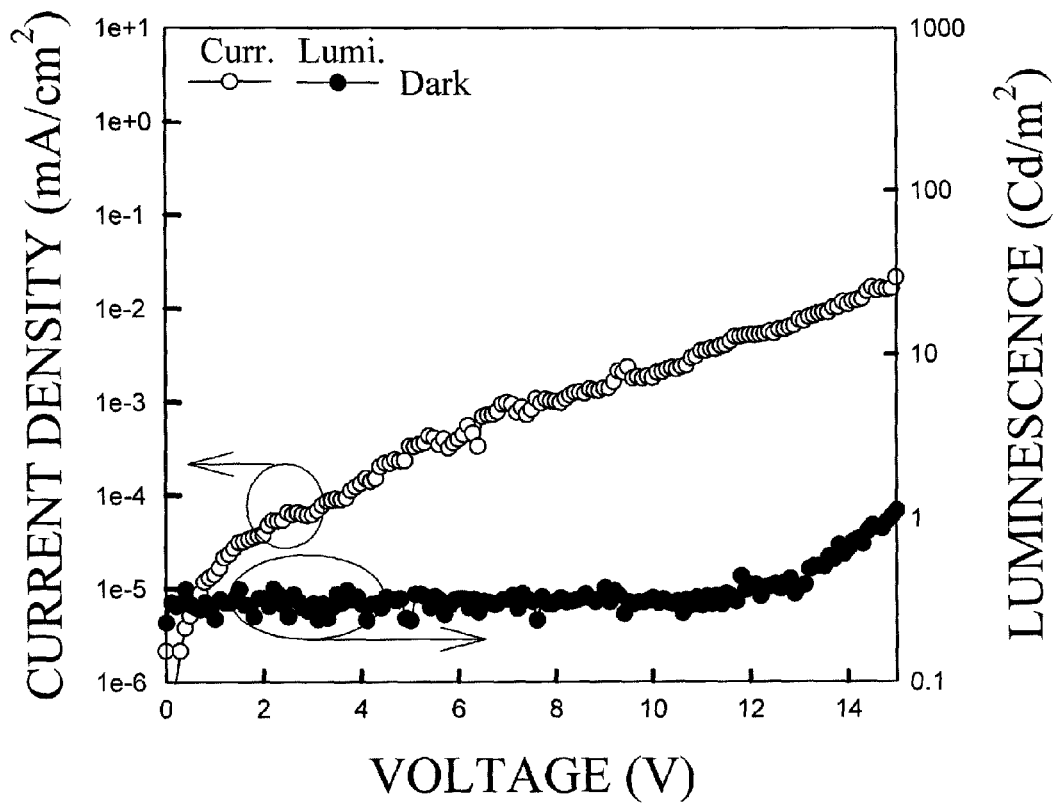
FIGS. 6A and 6B show the light-current-voltage characteristics of the device of FIG. 4, where
Figure 6B:
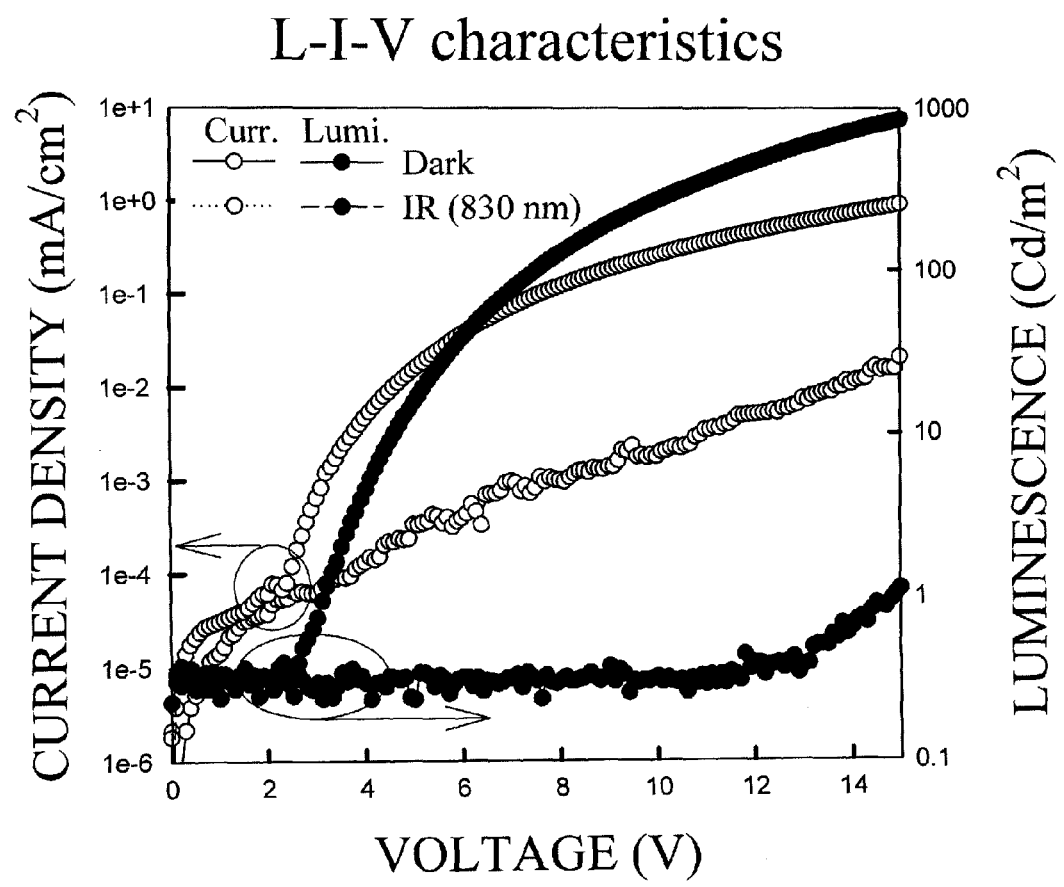

FIGS. 6A and 6B show the light-current-voltage (L-I-V) characteristics of the device of FIG. 5. CuPc: $\mu_h=7\times10^{-4}$ $cm^2/Vs$. SnPc: $\mu_h=2\times10^{-10}$ $cm^2/Vs$. FIG. 6A shows the characteristics when the device is not exposed to any infrared light. The open circle is current density and the closed circle is luminescence. As shown, in this embodiment, without infrared light irradiation, emission was not observed until 13 V. As discussed above, the high turn-on voltage in this embodiment is due to the poor hole injection from the $SnPc:C_{60}$ layer.

FIG. 6B shows the characteristics when the device is exposed to IR radiation. An 830 nm laser with 14 $mW/cm^2$ was used to irradiate the device. As shown, in this embodiment, the OLED was turned on at 2.7 V with infrared illumination from the laser. The maximum on/off ratio exceeded 1400 at 12.7 V.

Figure 7A:
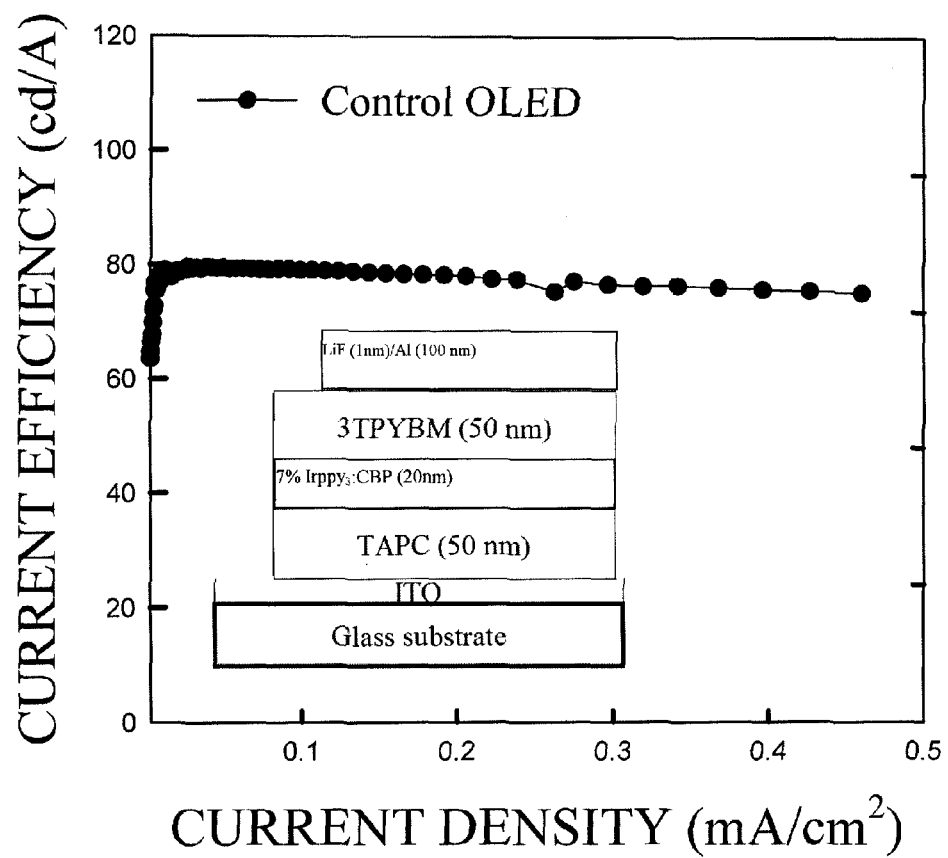
FIGS. 7A and 7B show the current efficiency of a control organic light emitting device (FIG. 7A) and the device of FIG. 4 (FIG. 7B).
Figure 7B:
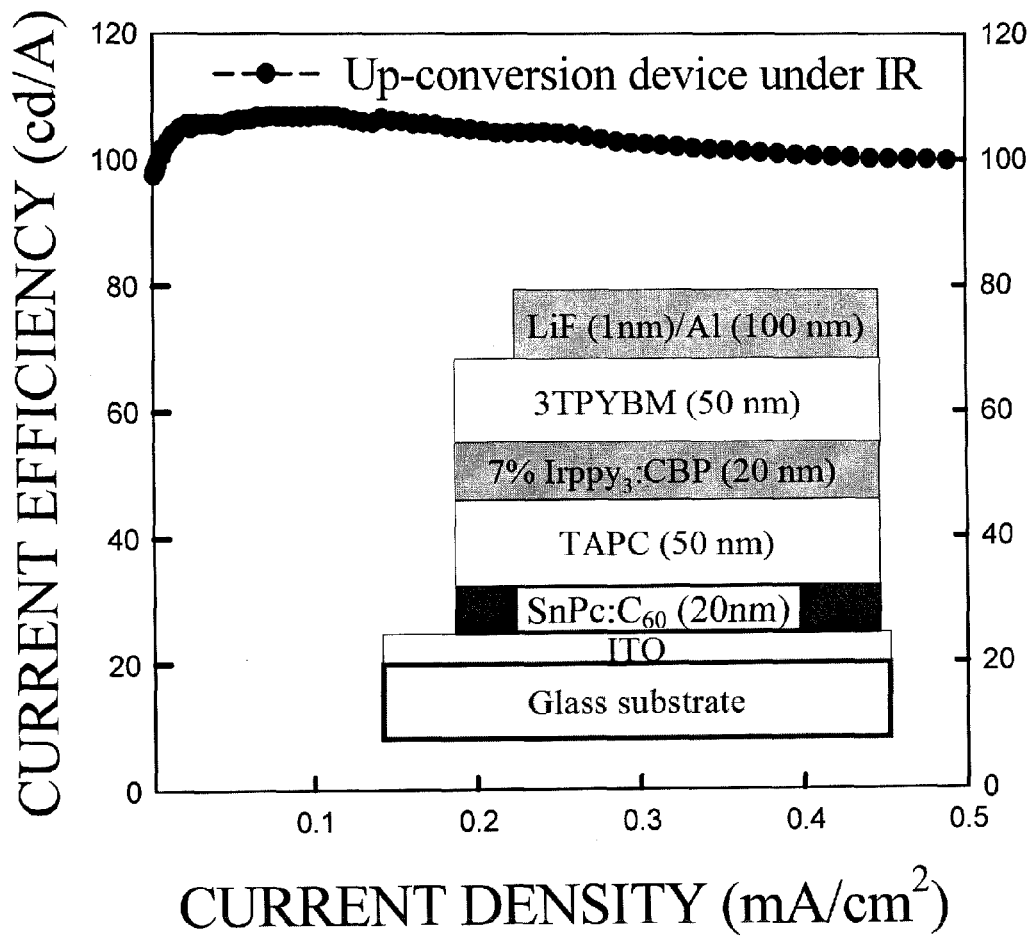

FIGS. 7A and 7B show the current efficiency of a control organic light emitting device (FIG. 7A) and the device of FIG. 4 (FIG. 7B). As shown, in this embodiment, the current efficiency under IR illumination is more than 100 cd/A. The higher current efficiency indicates that the control OLED is still charge imbalanced and slightly electron dominant.

Figure 8A:
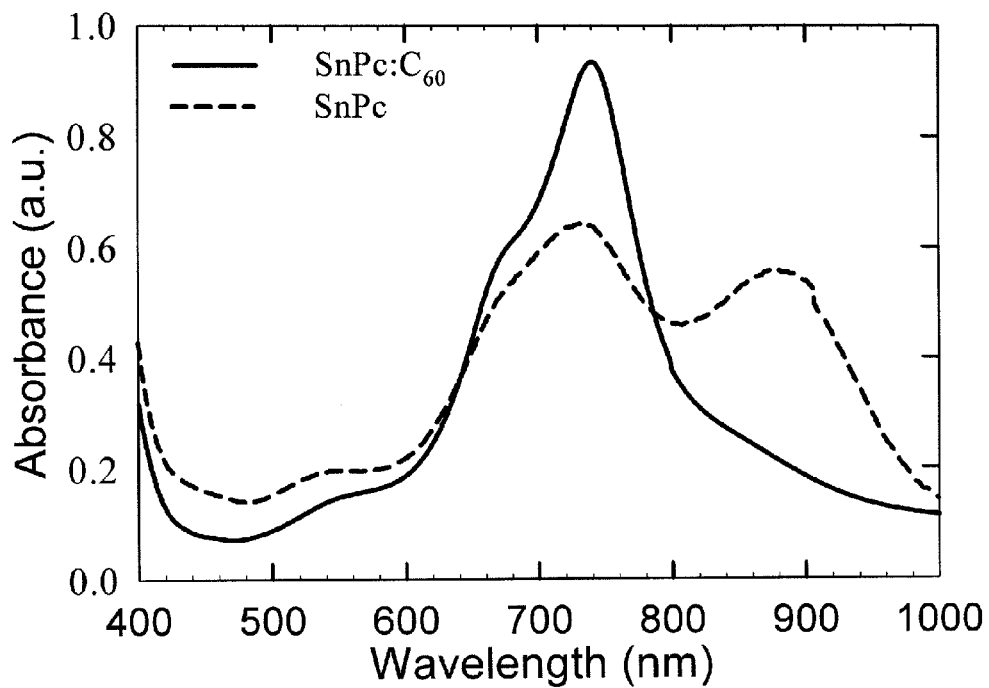
FIG. 8A shows the absorbance spectra of a 100 nm thick neat SnPc film and a 100 nm thick SnPc:$C_{60}$ mixed film in accordance with an embodiment of the subject invention.
Figure 8B:
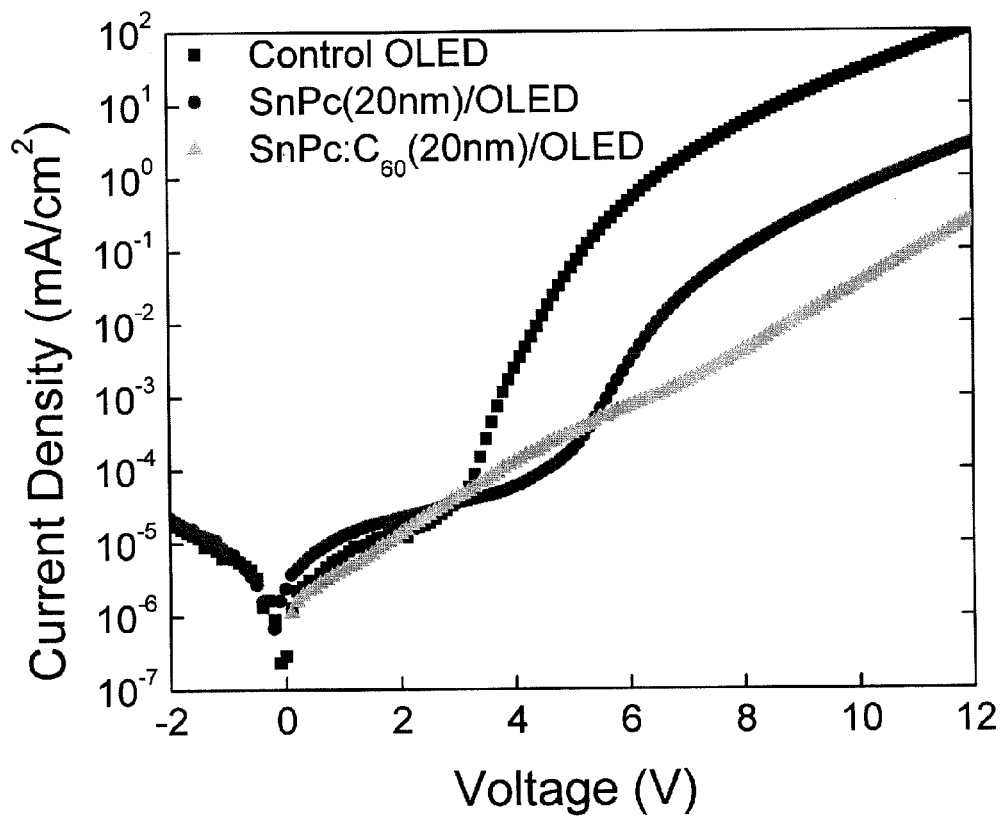
FIG. 8B shows the dark I-V characteristics of the control OLED (shown in the inset of FIG. 7A) and two up-conversion devices in accordance with embodiments of the subject invention, where one device has a 100 nm thick neat SnPc film and the other device has a 100 nm thick SnPc:$C_{60}$ mixed film.

According to certain embodiments of the present invention, a $SnPc:C_{60}$ bulk heterostructure layer is used for the poor hole transport IR sensitizing layer because of its strong IR absorption, as shown in FIG. 8A, and its poor hole transport property, as shown in FIG. 8B. FIG. 8B shows the dark current-voltage (I-V) characteristics of the control OLED (see inset of FIG. 7A) and up-conversion devices with NIR sensitizing layers in accordance with embodiments of the present invention. The addition of the neat SnPc layer increases the turn-on voltage from 3 V to about 5 V and the operating voltages across the measurement range also increases by about 2 V, indicating the poor hole transport properties of SnPc. The addition of the $SnPc:C_{60}$ mixed film further increases the operation voltage by another 2 V. Compared with the controlled OLED device, the up-conversion device with the $SnPc:C_{60}$ mixed layer shows a significant reduction of hole current.

Figure 9A:
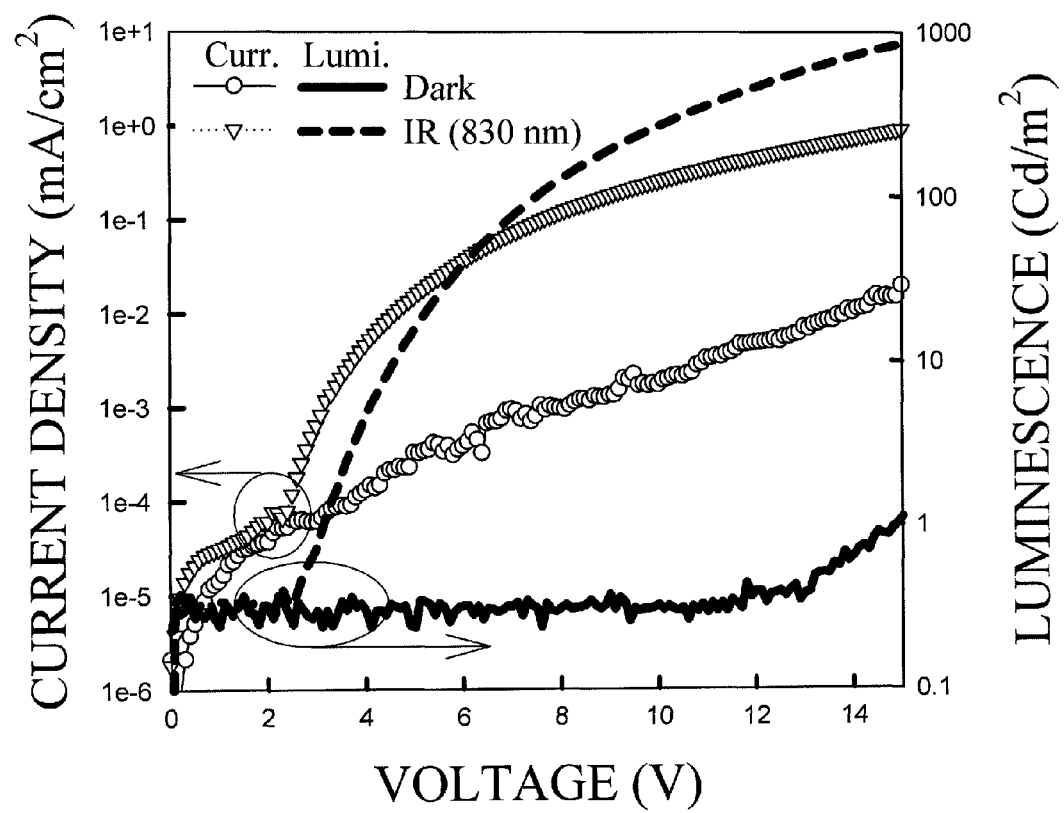
FIG. 9A shows light-current-voltage characteristics of an infrared-to-green light up-conversion device according to an embodiment of the subject invention under dark and photo (infrared) irradiation.
Figure 9B:
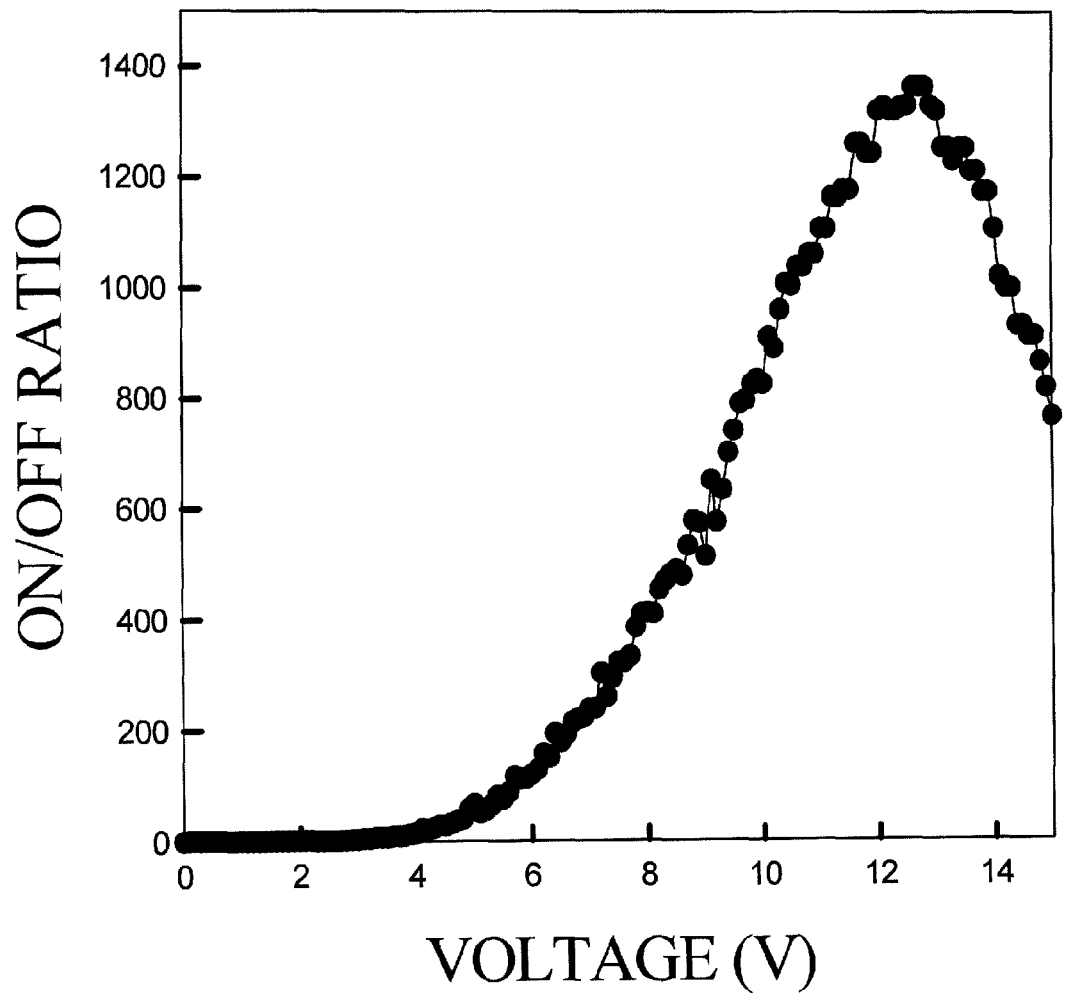
FIG. 9B shows a plot of the on/off ratio as a function of current densities for an infrared-to-green light up-conversion device in accordance with an embodiment of the subject invention.

FIG. 9A shows the luminescence-current-voltage (L-I-V) characteristics of the NIR-to-green up-conversion device with the $SnPc:C_{60}$ mixed film as a poor hole transport NIR-sensitizing layer according to an embodiment of the present invention. Without infrared light irradiation, emission was not detected until the voltage reaches 13 V, showing the maximum luminance (1 cd/m2) at 15 V. The high turn-on voltage indicates the poor hole transport from the $SnPc:C_{60}$ mixed layer. The current may be dominated by electrons injected from the cathode contact. Upon irradiation with NIR light, the device was turned on at 2.7 V along with on an onset of green light emission, showing a luminance of 853 cd/m2 at 15 V. Therefore, the switching effect by IR light is significant as shown in FIG. 9B, which provides the on/off ratio at different voltages. As shown, the maximum on/off ratio of luminescence intensity was about 1400 at 12.7 V.

Figure 10A:
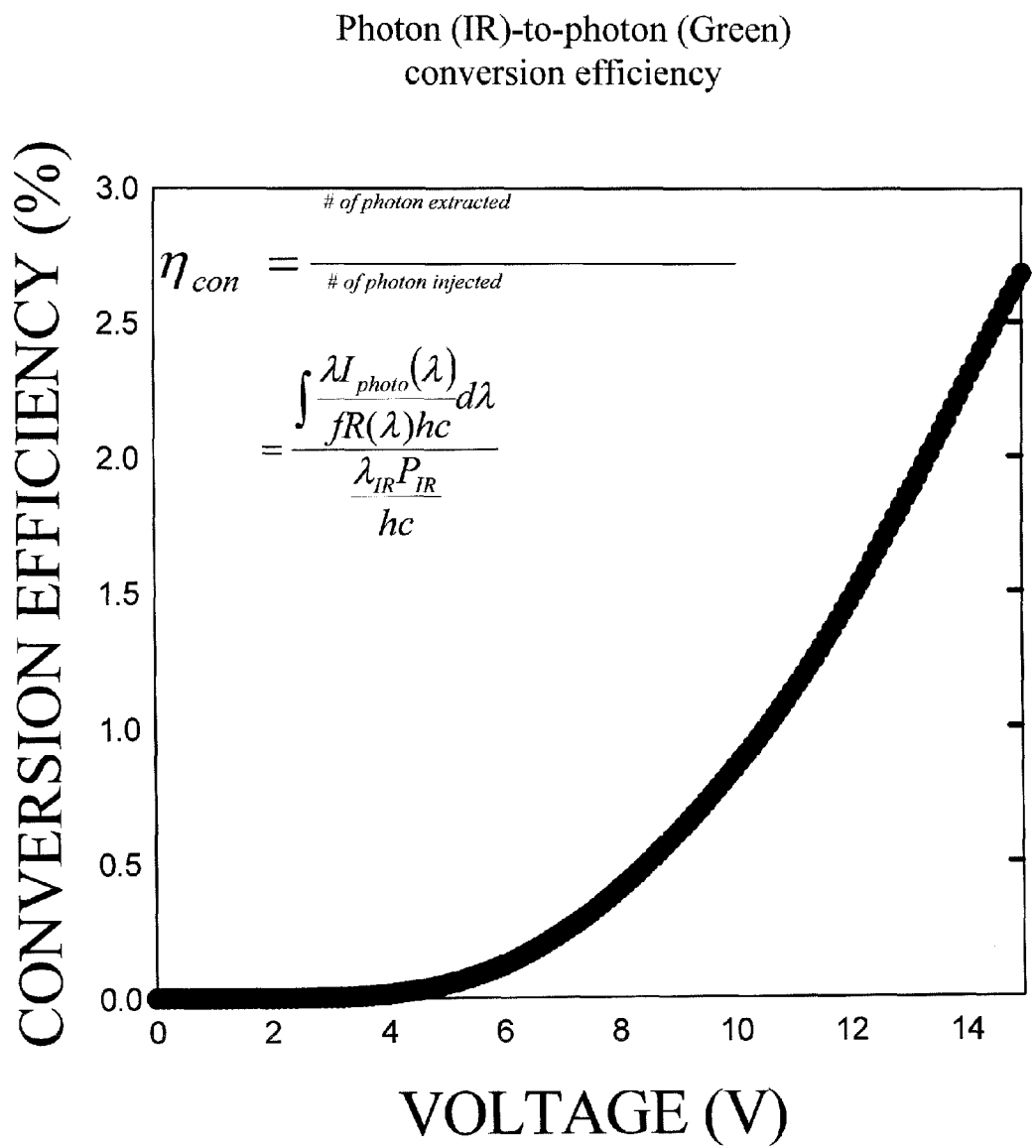
FIGS. 10A and 10B show the photon-to-photon conversion efficiency of the device of FIG. 5 (FIG. 11A) and the quantum efficiency of another embodiment of the subject invention (FIG. 11B).
Figure 10B:
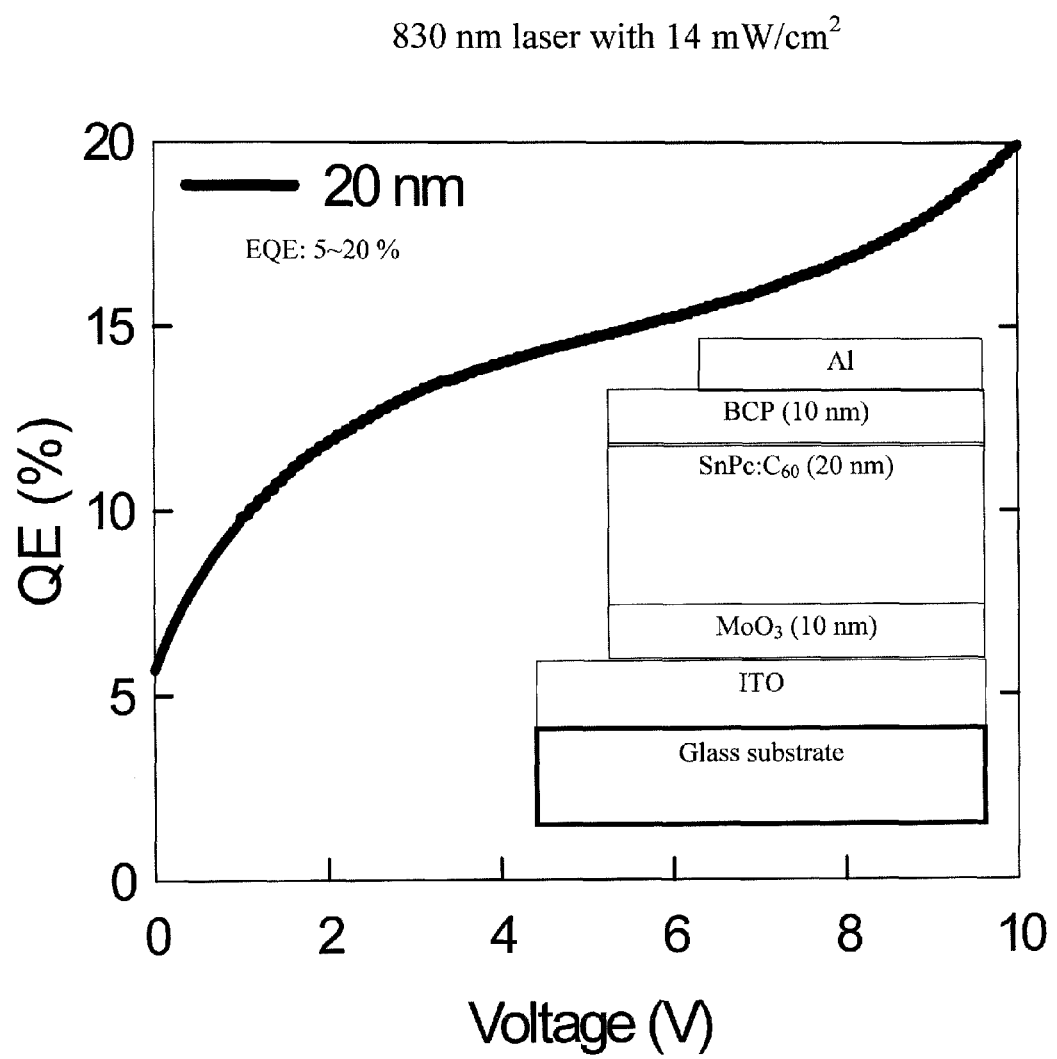

FIGS. 10A and 10B show the photon-to-photon conversion efficiency of the device of FIG. 4 (FIG. 10A) and the quantum efficiency (QE) of another embodiment of the subject invention (FIG. 10B).

The photon-to-photon conversion efficiency ($\eta_{con}$) from incident IR light photons to emitted green light photons can be calculated by the following equation:

$$\eta_{con} = \frac{\text{\# of photon extracted}}{\text{\# of photon injected}} = \frac{\int \frac{\lambda I_{photo}(\lambda)}{fR(\lambda)hc}d\lambda}{\frac{\lambda_{IR}P_{IR}}{hc}},$$

where h is Planks constant, c is the speed of light, $\lambda$ is the photon wavelength, $I_{photo}$ is the photocurrent, $f$ is the fraction of photons reaching the sensitizing layer, $R(\lambda)$ is the responsivity of the photodetector, $\lambda_{IR}$ is the incident infrared wavelength, and $P_{IR}$ is the incident infrared power.

Again, an 830 nm laser with 14 mW/cm² was used to irradiate the device. As shown, for the device of FIG. 4, the photon-to-photon conversion efficiency increases as the applied voltage increases, and the photon-to-photon conversion efficiency was 2.7% at 15 V. This up-conversion efficiency is significantly higher than the efficiencies of previously demonstrated all-organic up-conversion devices using the fluorescent OLED.

In the up-conversion device structure for the measurements, as shown in the inset of FIG. 10B, the whole photodetector structure is not used. Rather, the IR absorbing layer is used as the hole injection layer. Therefore, the exact external quantum efficiency is not measured from injecting IR light to extracting charge carriers. However, the external quantum efficiency is measured indirectly by making this photodetector structure. In the up-conversion device shown in the inset of FIG. 10B, a 20 nm thick SnPc:$C_{60}$ mixed layer is used alone, and the 830 nm IR laser with 14 mW/cm2 is used for the IR source. In a same IR irradiation and same IR absorbing layer thickness, 5~20% external quantum efficiency (EQE) was obtained.

The EQE of the Irppy$_3$ based OLED is roughly 20% in the literature. Therefore, the calculated conversion efficiency is about 1~4% and it is consistent with the experimental conversion efficiency. This conversion efficiency is roughly 10 times higher than that of the red-to-green up-conversion devices.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein.

A greater understanding of the present invention and of its many advantages may be had from the foregoing examples, given by way of illustration. The foregoing examples are illustrative of some of the methods, applications, embodiments and variants of the present invention. They are, of course, not to be considered in any way limitative of the invention. Numerous changes and modifications can be made with respect to the invention.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A device for sensing infrared (IR) radiation, comprising:
    an IR sensing layer, wherein the IR sensing layer has a current density of less than 1 mA/cm²; and
    an organic light emitting diode (OLED) on the IR sensing layer, wherein the OLED is arranged to receive electrons generated in the IR sensing layer.

2. A device for sensing infrared (IR) radiation, comprising:
    an IR sensing layer, wherein the IR sensing layer has a current density of less than 1 mA/cm²; and
    an organic light emitting diode (OLED) on the IR sensing layer, wherein the OLED is arranged to receive holes generated in the IR sensing layer.

3. The device according to claim 2, wherein the IR sensing layer is in contact with the OLED, further comprising a first electrode, and a poor hole transporting layer positioned between the IR sensing layer and the first electrode, wherein the poor hole transporting layer has a current density of less than 1 mA/cm².

4. The device according to claim 2, wherein the IR sensing layer comprises SnPc:$C_{60}$.

5. The device according to claim 2, wherein the OLED comprises a phosphorescent emitter.

6. The device according to claim 2, wherein the IR sensing layer comprises:
    an organic infrared absorbing material, and
    an acceptor material, wherein the organic IR absorbing material and the acceptor material are mixed in the IR sensing layer.

7. The device according to claim 2, wherein the IR sensing layer comprises a fullerene.

8. The device according to claim 2, wherein the IR sensing layer comprises quantum dots.

9. A method for sensing infrared (IR) radiation, comprising:
    providing a device, wherein the device comprises:
        an IR sensing layer, wherein the IR sensing layer has a current density of less than 1 mA/cm²; and
        an organic light emitting diode (OLED) on the IR sensing layer, wherein the OLED is arranged to receive sensing electrons generated in the IR sensing layer; and
    exposing the IR sensing layer to IR radiation, wherein upon exposing the IR sensing layer to IR radiation, a sensing electron and a sensing hole are generated in the IR sensing layer and the sensing electron passes to the OLED such that an emitted photon is produced by the sensing electron combining with a hole in the OLED.

10. A method for sensing infrared (IR) radiation, comprising:
providing a device, wherein the device comprises:
an IR sensing layer, wherein the IR sensing layer has a current density of less than 1 mA/cm$^2$; and
an organic light emitting diode (OLED) on the IR sensing layer, wherein the OLED is arranged to receive sensing holes generated in the IR sensing layer; and
exposing the IR sensing layer to IR radiation, wherein upon exposing the IR sensing layer to IR radiation, a sensing electron and a sensing hole are generated in the IR sensing layer and the sensing hole passes to the OLED such that an emitted photon is produced by the sensing hole combining with an electron in the OLED.

11. The method according to claim 10, wherein the IR sensing layer is in contact with the OLED, further comprising a first electrode, and a poor hole transporting layer positioned between the IR sensing layer and the first electrode, wherein the poor hole transporting layer has a current density of less than 1 mA/cm$^2$.

12. The method according to claim 11, wherein the poor hole transporting layer comprises SnPc:C$_{60}$.

13. The method according to claim 10, wherein the OLED comprises a phosphorescent emitter.

14. The method according to claim 10, wherein the IR sensing layer comprises:
an organic infrared absorbing material, and
an acceptor material, wherein the organic IR absorbing material and the acceptor material are mixed in the IR sensing layer.

15. The method according to claim 10, wherein the IR sensing layer comprises a fullerene.

16. The method according to claim 10, wherein the IR sensing layer comprises quantum dots.

* * * * *